(12) United States Patent
Fu et al.

(10) Patent No.: US 7,025,909 B2
(45) Date of Patent: *Apr. 11, 2006

(54) METHOD FOR PRODUCING SPHERE-BASED CRYSTALS

(75) Inventors: Guoyi Fu, Savannah, GA (US); Diane Lewis, Savannah, GA (US)

(73) Assignee: EMD Chemicals, Inc., Gibbstown, NJ (US)

( * ) Notice: Subject to any disclaimer, the term of this patent is extended or adjusted under 35 U.S.C. 154(b) by 73 days.

This patent is subject to a terminal disclaimer.

(21) Appl. No.: 10/837,627

(22) Filed: May 4, 2004

(65) Prior Publication Data

US 2004/0262790 A1 Dec. 30, 2004

Related U.S. Application Data

(63) Continuation of application No. 09/878,189, filed on Jun. 12, 2001, now Pat. No. 6,863,847.

(60) Provisional application No. 60/211,464, filed on Jun. 15, 2000.

(51) Int. Cl.
*B29D 11/00* (2006.01)

(52) U.S. Cl. .............. 264/1.21; 264/87; 264/109; 264/122

(58) Field of Classification Search .......... 264/1.1, 264/1.21, 87, 109, 122, 1.7, 344, 345, 128; 427/249.2, 255.12, 128
See application file for complete search history.

(56) References Cited

U.S. PATENT DOCUMENTS

| 3,138,475 | A | | 6/1964 | Schroder et al. |
|---|---|---|---|---|
| 3,497,367 | A | | 2/1970 | Gaskin et al. |
| 3,617,437 | A | * | 11/1971 | Bagg et al. ............... 162/102 |
| 4,191,805 | A | * | 3/1980 | Nolte ...................... 428/689 |
| 4,451,412 | A | | 5/1984 | Loiseaux et al. |
| 4,627,689 | A | | 12/1986 | Asher |
| 4,775,520 | A | | 10/1988 | Unger et al. |
| 4,911,903 | A | | 3/1990 | Unger et al. |
| 4,986,635 | A | | 1/1991 | Spry |
| 5,131,736 | A | | 7/1992 | Alvarez |
| 5,330,685 | A | | 7/1994 | Panzer et al. |
| 5,337,185 | A | | 8/1994 | Meier et al. |
| 5,342,552 | A | | 8/1994 | Panzer et al. |
| 5,385,114 | A | | 1/1995 | Milstein et al. |
| 5,559,825 | A | | 9/1996 | Scalora et al. |
| 5,618,872 | A | | 4/1997 | Pohl et al. |
| 5,645,929 | A | | 7/1997 | Debe |
| 5,684,817 | A | | 11/1997 | Houdre et al. |
| 5,712,648 | A | | 1/1998 | Tsujiguchi |
| 5,740,287 | A | | 4/1998 | Scalora et al. |
| 5,748,057 | A | | 5/1998 | De Los Santos |
| 5,804,919 | A | | 9/1998 | Jacobsen et al. |

(Continued)

FOREIGN PATENT DOCUMENTS

DE 4316814 A1 11/1994

(Continued)

OTHER PUBLICATIONS

Joannopoulos, et al., Photonic Crystals, Molding the Flow of Light, 1995, pp. 1-137.

(Continued)

*Primary Examiner*—Mathieu D. Vargot
(74) *Attorney, Agent, or Firm*—Millen, White, Zelano, Branigan, P.C.

(57) ABSTRACT

A moving bed filtration process for the production of sphere based crystals is disclosed. Sphere based crystals having an opal-like structure or an inverse opal-like structure can be produced in accordance with the invention.

21 Claims, 3 Drawing Sheets

U.S. PATENT DOCUMENTS

| | | | |
|---|---|---|---|
| 5,846,310 | A | 12/1998 | Noguchi et al. |
| 5,907,427 | A | 5/1999 | Scalora et al. |
| 6,261,469 | B1 * | 7/2001 | Zakhidov et al. ............. 216/56 |

FOREIGN PATENT DOCUMENTS

| | | |
|---|---|---|
| DE | 19842134 A1 | 4/2000 |
| DE | 19929109 A1 | 12/2000 |
| EP | 0216278 A2 | 4/1998 |
| WO | WO 93/08237 A1 | 4/1993 |
| WO | WO 93/25611 A1 | 12/1993 |
| WO | WO 97/43346 A1 | 11/1997 |
| WO | WO 97/43348 A1 | 11/1997 |

OTHER PUBLICATIONS

Velev et al., A Class of Microstructured Particles Through Colloidal Crystallization, Mar. 24, 2000, vol. 287, pp. 2240-2243.

Bertone, et al., "Thickness Dependence of the Optical Properties of Ordered Silica-Air and Air-Polymer Photonic Crystals", Jul. 12, 1999, vol. 83, No. 2, pp. 300-303.

Bogush, et al. "Preparation of Monodisperse Silica Particles: Control of Size of Mass Fraction," Journal of Non-Crystalline Solids, vol:104 pp. 95-106 (1988).

Stober et al., "Controlled Growth of Monodisperse Silica Spheres in the Micron Size Range", 1968, pp. 63-69.

Srinivasarao, "Nano-Optics in the Biological World: Beetles, Butterflies, Birds, and Moths", Chem. Rev. 1999, pp. 1935-1961.

Sanders, "Diffraction of Light by Opals," *ACTA Crystallographica*, vol. A24, 1968, pp-427-434.

Sanders, "Colour of Precious Opal." Nature, vol. 204, pp 1151-1153 (Dec. 19, 1964).

Asher et al., "Self-Assembly Motif for Creating Submicron Periodic Materials. Polymerized Crystalline Colloidal Arrays," J. Am. Chem. Soc. 1994, 116, pp 4997-4998.

Park et al., "Assembly of Mesoscale Particles over Large Areas and its Application in Fabricating Tunable Optical Filters," Langmuir 1999, 15, pp 266-273.

Wunhoven et al., "Preparation of Photonic Crystals Made of Air Spheres in Titania," Science. vol. 281, pp. 802-804, (Aug. 7, 1998).

Zakhidov et al., "Carbon Structures with Three-Dimensional Periodicity at Optical Wavelengths," Science, vol. 282, pp 897-901 (Oct. 30, 1998).

US 5,571,466, 05/12/1998 Dowling et al. (withdrawn).

* cited by examiner

FIG. I

METHOD FOR PRODUCING SPHERE-BASED CRYSTALS

CROSS-REFERENCE TO RELATED APPLICATIONS

This application is a continuation of application Ser. No. 09/878,189 filed Jun. 12, 2001, now U.S. Pat. No. 6,863,847 and claims the benefit under 35 U.S.C. 119(e) of provisional application No. 60/211,464 filed Jun. 15, 2000.

BACKGROUND OF THE INVENTION

Precious opals are well known for their striking color displays. The strong color effect by these natural gemstones typically originates from their unique structures formed by closely packed uniformly sized silica spheres (Sanders, 1964, *Nature* 204:1151–1153; *Acta Crystallogr.*, 24:427–434). These highly organized structures (super-latices of silica spheres), with sphere sizes in range that diffracts visible light, selectively diffract certain wavelengths of visible light and thereby produce strong, angle dependent colors corresponding to the diffracted wavelengths.

In the prior art of synthetic opals, silica spheres were first synthesized and then fractionated into fractions having a narrow particle size distribution. Thereafter, spheres with a desired range of size and uniformity were assembled into closely packed arrays by sedimentation or centrifugation. The packed arrays were finally stabilized by heating or by the use of a cement-like material to bond the spheres together.

Recently it has been discovered that materials with opal-like structures may be used as photonic band gap materials or crystals. An ideal photonic band gap crystal has the capability to manipulate light (photons) in the same way as semiconductors manipulate electrons. These crystals with complete band gaps hold the promise for future super-fast optical computing and optical communication technologies.

An object of the present invention is to provide a novel process for the production of opal-like structures and to any novel intermediate and final products produced thereby. Upon further study of the specification and appended claims, other objects and advantages of the invention will become apparent.

SUMMARY OF THE INVENTION

It has been discovered according to the invention described herein that sphere based crystals can be produced using a moving bed vacuum filtration process. As used herein, sphere-based crystals refers to crystals having an opal-like structure or an inverse opal-like structure, an opal-like structure refers to crystals comprising highly ordered spheres, and an inverse opal-like structure refers to crystals comprising highly ordered three dimensional air-spheres or bubbles.

In one aspect, sphere based crystals produced according to the invention may be used as light diffraction pigment products, particularly, for example, as particulate pigment products. Pigment products according to the invention, may provide color effects in the visible light (VIS) range. Additionally, pigment products according to the invention may be suitable as functional infrared (IR) pigments or ultraviolet (UV) barrier pigments.

In another aspect, sphere based crystals produced according to the invention may be used as photonic crystals, particularly, for example, for photonic and optoelectronic applications. Particularly contemplated as an aspect of the invention are photonic band gap crystals produced by the methods disclosed herein. As used herein, photonic band gap crystals are one or more dimensional dielectric structures with refractive index modulations in the range of optical frequencies. As a result, their optical properties are dominated by strong diffraction effects and the propagation of the electromagnetic waves is strongly inhibited over a finite band of frequencies; this produces a dip in the transmission spectrum known as a stop band. Photonic band gap crystals have been described for example in the following references: Joannopoulos et al., *Photonic Crystals, Molding of the Light*, Princeton University Press; Costas M. Soukoulis (ed.), *Photonic Band Gap Materials*, NATO ASI Series E, Vol. 315, Kluwer Academic Publishers; Asher, et al., 1994, *J. Am. Chem. Soc.*, 116:4997–4998; Wijnhoven, et al., 1998, *Science* 281:802–804; Zakhidov, et al., 1998, *Science* 282:897. Photonic band gap crystals may be employed, for example, in optical filtering, optical switching, or optical sensing. Particularly preferred photonic band gap crystals are crystals with complete band gaps, which may be employed, for example, in super-fast optical computing and optical communication applications. As used herein, photonic band gap crystals having complete band gaps are defined as a three-dimensional periodic structure in which a frequency band of electromagnetic waves is forbidden, irrespective of propagation directions in space.

Sphere based crystals according to the invention may be synthesized using a moving bed vacuum filtration process. The bed may move continuously throughout the preparation processes or stepwise from one preparation zone to the next. Typically a suspension of spheres is brought into contact with a moving filtration membrane (belt) which moves preferably substantially horizontally over a vacuum zone. While moving through the vacuum zone, the suspension gradually becomes de-watered and the spheres gradually become closely packed. After packing of the monospheres, the packed monospheres are typically processed for stabilization. The process of the invention typically comprises the following preferred phases:

(1) monospheres are added to the moving bed filtration membrane, either while the bed is moving or while the bed is stationary;

(2) monospheres on the membrane are moved horizontally over a vacuum filtration zone;

(3) the packed monospheres are processed for stabilization.

The above described phases can be accomplished sequentially, or with one or more steps occurring simultaneously. For example, optionally, the monospheres may be added to a moving bed filtration membrane while the bed is moving and/or while a vacuum filtration pressure is being applied to the packed spheres. Additionally, optionally, the packed monospheres may be processed for stabilization while the bed is moving and/or while a vacuum is being applied to the packed monospheres.

The vacuum belt filter is preferred to other filtration processes because (a) a horizontal, flat surface seems to be necessary to achieve good structure ordering of the crystals, (b) an open-up upper surface of filtered layer facilitate the infiltration and other treatments, (c) a thin (mm range at most) and even filtered layer is necessary to achieve complete and homogeneous infiltration which both the rotary and pressure filtration processes appear difficult to control.

Processing of the packed monospheres for stabilization can include, for example, heating of the packed monospheres, or application of a chemical bonding agent to the packed monospheres, including, for example, infiltration of the interstitial spaces of the packed monospheres with a bonding agent. Typically, chemical bonding agents include but are not limited to precursors for metal oxides, for example, nano-sols of silica, zirconia, titania, tin oxide, etc.; partially hydrolyzed alkoxides of silicon, zirconium, titanium, tin, etc.; precursors for polymers, for example, styrene, methyl acrylate and methyl methacrylate; uncured and partially cured condensation polymers, for example the area or as other known bonding agents for silica. Typically, after infiltration of the packed monospheres with the bonding agent, the bonding agent may be processed further to cure the bonding agent. Processing of the bonding agent may include, for example, drying, polymerization, or condensation of the bonding agent. Preferably, the infiltration of the packed monospheres with the bonding agent is accomplished while the packed monospheres are being conveyed by the moving bed filtration membrane and/or while vacuum filtration pressure is being applied to the packed monospheres. Also preferably, curing of the bonding agent is accomplished while the packed monospheres are being conveyed by the moving bed filtration membrane and/or while vacuum filtration pressure is being applied to the packed monospheres.

Also contemplated as part of the invention is the stabilization of the packed monospheres using a hydrothermal process. Preferably, the surfaces of the monospheres comprise reactive tangling groups which would form interspheric bonds during the hydrothermal process. Treatment of the packed silica monospheres with a dilute base solution would generate a certain amount of hydroxyl groups on the surface of the monospheres. These hydroxyl groups between neighboring spheres would condense during hydrothermal treatment to bind the structure together. Alternatively, a suitable amount of nano-sols of an oxide, e.g., silica, zirconia, etc. may be added before the treatment, which would also condense with the spheres to form a stable structure.

After removal of the packed monospheres from the moving bed filtration membrane, the packed monospheres may undergo further finishing treatments. For example, to obtain sphere based crystals with an inverse opal-like structure, the packed spheres which are bonded together by a bonding agent may be treated with a dissolving agent to remove the substance of the spheres. Typically, such treatment of the spheres would be accomplished after the bonding agent has been cured.

A wide concentration range of the suspension of monospheres may be crystallized by this process, from as dilute as a few percent of solids, e.g. 2% to as concentrated as 50% solids. However, a very dilute solution would take a long time to filter and very concentrated suspension may worsen the ordering of the crystal. The preferred concentration range of the monospheres is thus from 10% solids to 20% solids. The suspending vehicle is preferably water, but other liquids can also be employed.

A variety of filtering membranes may be used in this process. An important parameter that has to be considered in selecting a specific membrane is the pore size, which should be equal or slightly smaller than the spheres to be filtered. For small scale preparations, polymer filtering membranes produced by, for example, Millipore or Osmonics, may be used. For large scale production, membrane cloths such as Gore-Tex® Membrane/Polypropylene Felt Laminate made by W. L. Gore may be used.

The vacuum level is also an important parameter that largely determines the filtration speed and to certain degrees determines the ordering of the crystal. It should be maintained substantially constant throughout the process to ensure a homogeneous packing of the monospheres. The preferred vacuum range is from ~400 mm Hg to ~600 mm Hg. The moving speed of the filtering membrane is determined by the speed of filtration, which is mainly determined by the amount of spheres to be filtered per unit area of the filtering membrane, that is the thickness of the filtered cake. Relatively fast filtering speed may be accomplished without compromising the crystal quality by working with relatively thin layers of the monospheres. The layer thickness may range from 50 μm to 5 mm. The preferred thickness is from 200 μm to 1 mm. If a step-by-step moving process is used, the interval of steps is determined by the slowest step of the process, typically the filtration step.

BRIEF DESCRIPTION OF THE DRAWINGS

As shown in FIG. 1, monospheres are added to a moving filtration membrane or belt in zone I, while the bed is moving and while vacuum filtration pressure is being applied to zone I. In zone II, crystallization of the monospheres occurs via application of vacuum filtration pressure while the monospheres are conveyed by the membrane. In infiltration zone III, a bonding agent is added to the packed monospheres while the monospheres are conveyed by the membrane and while a vacuum filtration pressure is applied. In zone IV, the bonding agent is solidified or cured, and in this zone vacuum application may not be necessary. Alternatively, and more preferably, the zones are physically separated from one another with zone II and zone III having individually controlled vacuum sources. In this process, the bed moves stepwise and the conveying membrane moves the materials from one zone to the next, step by step. In zone one, the pretreatment zone, the suspension may be pretreated ultrasonically to enhance the dispersion of the spheres. In zone II and zone III, same as above, the monospheres are organized by filtration and infiltrated by a binding agent, respectively. Also same as above, in zone IV, the monospheres are bound together to form a stable structure, and when high temperature treatment is not needed the stable structure is further processed as a final product in zone V. When high temperature treatment is necessary, the last step illustrated in FIG. 1 would be done separately. After the packed monospheres have been removed from the moving bed filtration membrane, the packed monospheres are further processed using high temperature finishing treatments to obtain the opal-like crystals or inverse opal-like crystals of the invention. The crystals were finally collected typically as millimeter size platelets, ground into the desired particle size range using either mechanical or fluid energy mills, and classified into different fractions with desired size ranges. The (↓) symbol in the diagram indicates the application of a vacuum filtration pressure.

Figure 1:
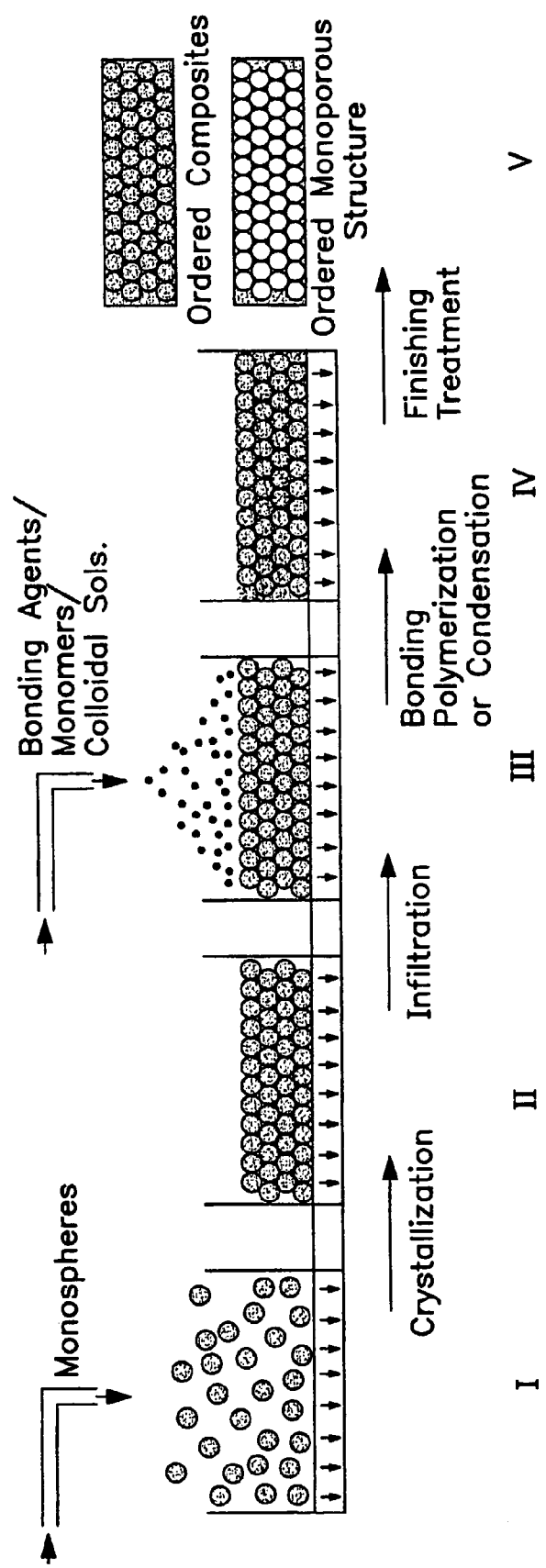
FIG. 1 is a schematic flowsheet of an embodiment of the process of the invention.

Also contemplated as part of this invention are pigment compositions containing pigment particles, wherein the pigment particles comprise sphere based crystals having either an opal-like structure or an inverse opal-like structure.

Pigment particles will typically range in size from a few microns to a few millimeters, preferably from 50 microns to 1000 microns. Pigment compositions which are contemplated as part of this invention include paint compositions, cosmetic compositions, and plastic compositions. The most preferred particle size range for paint and cosmetic compositions is from 50 to 300 microns. The most preferred particle size range for plastic composition is from 100 to 500 microns.

The spheres employed in the process are typically comprised of silica or polymer material, including synthetic polymer material or natural polymer material. There is virtually no limitation regarding the material that comprises the sphere material, although the number of commercially available spherical products, particularly those with high size uniformity, is relatively small. For example, the spheres may comprises silica, polystyrene, polymethacrylate and polyvinyltoluene.

Monodispersed silica spheres may be prepared following the well-known process by Stober, Fink and Bohn (J. Colloid Interface Sci. 1968, 26,62). The silica monospheres used in the current invention were products of Merck, KgaA or prepared in house using the technology in U.S. Pat. No. 4,775,520 and U.S. Pat. No. 4,911,903. Monodispersed polymer spheres may be purchased from IDS (Interfacial Dynamics Corp.), Bangs Laboratories and Duke Scientific. More detailed information regarding monodispersed spheres may be found in a recent review article by Y. Xia, et al. (Advanced Materials, 2000, 12(10), 693–713). Theoretically any one or a combination of materials may be used as far as they are single sized spheres having monodispersity.

For inverse opal-like structures, the spheres employed in the process are preferably comprised of polymeric materials which could be easily removed by thermal treatment. However, silica spheres may be used especially when a polymeric inverse opal structure is the preferred product. In this case, the silica may be removed after the polymeric framework is formed by dissolving the silica away with dilute hydrofluoric acid (see, for example, Colvin, et al., J. Am. Chem. Soc. 1999, 121, 11630–11637).

Sizes for the monospheres employed will be chosen based on the specific application intended. For the formation of sphere-based crystals for photonic crystals in the optical region, monospheres typically have a diameter of about 20 nm to about 30 µm, preferably about 100 nm to about 10 µm. For crystals that work in the visible light range, such as for color pigment applications, the typical monosphere size ranges from about 150–450 nm, preferably about 200–300 nm. For crystals that work in the UV light region, the typical monosphere size ranges from about 20–200 nm, preferably about 50–150 nm. Similarly, for crystals that work in the infrared (IR) light region, the typical monosphere size ranges from about 350 nm to 30 microns, preferably about 450 nm to 10 microns. Thus from an overall standpoint, the monospheres may have a size in the range of about 20 nanometers to about 30 microns.

The monosphere size for the reflection of a certain wavelength may be estimated using the Bragg equation ($\lambda=2nd \sin \theta$), where $\lambda$ is the wavelength diffracted, n is the refractive index of the structure, d is the plane spacing, and $\theta$ is the Bragg glancing angle. For example, the longest wavelength ($\theta=\pi/2$) diffracted by the 1010 planes of a hexagonal closely packed structure (d=$r\sqrt{3}$, r is the radius of the spheres) would be $\lambda=5.02r$ (assuming n=1.45 for a structure based on silica spheres. For inverse opal-like structures where the spheres are thermally removed, the lattice parameters normally decrease during the thermal removal process. This lattice shrinkage should be taken into account in the estimation of the diffracted wavelength. The estimated refractive index of the inverse opal-like structure material would also be needed.

A very large number of precursor materials are available for the infiltration process. For example, any colloid species with a particle size range considerably smaller than the size of the spheres that form the crystal may be employed to infiltrate the crystal. Thus, a large number inverse opal-like structures based on metal and semiconductor materials may be employed including but not limited to Au, Ag, Si, and Ge. Additionally, for example, metal oxides may be employed as the infiltrating material. Particularly, metal alkoxides that can be controllably hydrolyzed into sols may be used for oxide filtration. Metal oxide species that may be employed include, for example, $SiO_2$, $Al_2O_3$, $TiO_2$, $SnO_2$, $Fe_2O_3$, $ZrO_2$, $CeO_2$ and $Y_2O_3$. All of these materials have been tested in accordance with the invention as infiltrating materials for the formation of inverse opal-like structures, using polymer spheres. Relatively well organized air-sphere containing structures were produced in all cases, although the quality may vary from one material to another. Organometallic precursors may be employed to generate nitrides, carbides, and borides, as well as metal and semiconductor structures. Additionally, organic or organometallic monomers may be infiltrated into the crystal structures and subsequently polymerized into organic, organometallic or inorganic networks. These materials are for inverse structure only. They can not be made into evenly sized spheres based on currently available technologies, so can not be made into normal opal structures.

The moving bed vacuum filtration process for the production of sphere-based crystals may be used to produced crystals with an opal-like structure or an inverse opal-like structure which are based on monodispersed systems, bi-dispersed systems, or poly-dispersed systems. In a monodispersed system, the spheres employed are essentially of one size. In a bi-dispersed system, spheres of two different sizes are employed. In a polydispersed system, spheres with greater than two different sphere sizes are employed.

It is also contemplated as part of this invention that spheres of two or more different materials may be organized to form one crystal structure. For example, both polymer spheres and silica spheres may be organized into one crystal structure. The process according to the invention may require special considerations when spheres of different materials are employed. If the specific gravity of the two different types of spheres is different, the sphere types may become separated during the filtration crystallization process. Additionally, if the surface properties of the two different types of spheres are different, separation, flocculation, or agglomeration may occur, resulting in poor crystal structures.

In another aspect of the invention, spheres to be crystallized are coated with a layer of desired materials, or two or more layers of desired materials, (e.g. metals, metal oxides, or semiconductor materials, etc). Relatively uniform layers of coating are preferred in order to maintain a highly ordered structure.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius; and, unless otherwise indicated, all parts and percentages are by weight.

The entire disclosure of all applications, patents and publications, cited above and below, are hereby incorporated by reference.

EXAMPLES

Example 1

Preparation of Crystals having an Opal-Like Structure Using the Moving Bed Filtration Process.

Figure 2:
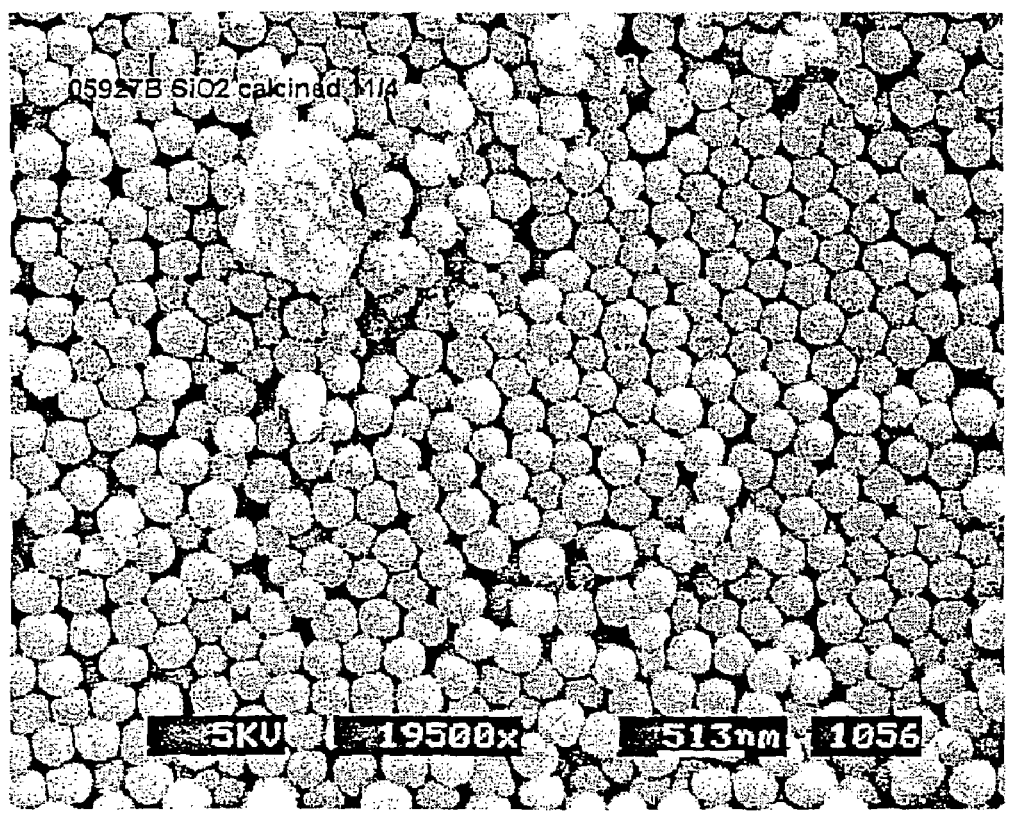
FIG. 2 is a scanning electron microscope (SEM) photograph of a crystal of $SiO_2$ spheres produced by the moving bed filtration process of the instant invention, as described in Example 1 below.

Monodispersed spheres comprising SiO2 (Merck of Germany or EM Industries Inc. Monosphere product) and having a diameter of approximately 250 nm were assembled into ordered crystals, using the stepwise vacuum bed filtration process according to the invention. The concentration of the suspension is about 12 weight % in deionized water. A vacuum of about 20 in. Hg was used in the filtration process. After the filtration, which takes about 30 minutes, the filtered layer was moved to the next stage, drying. Drying was done by using an infrared heater put over the drying zone while the vacuum application was maintained. This process typically takes about 20 to 40 minutes. After drying, the crystals were transferred from the filter to a crucible, treated at 800° C. for about 12 hours to stabilize the crystals. A photographic image of the formed crystal is shown in FIG. 2. The material showed a red diffraction color when viewed at an angle close to the normal axis of crystal surface, and a green diffraction color when viewed at an angle that is far away from the normal axis.

Example 2

Preparation of Crystals having an Inverse Opal-Like Structure Using the Moving Bed Filtration Process.

Figure 3:
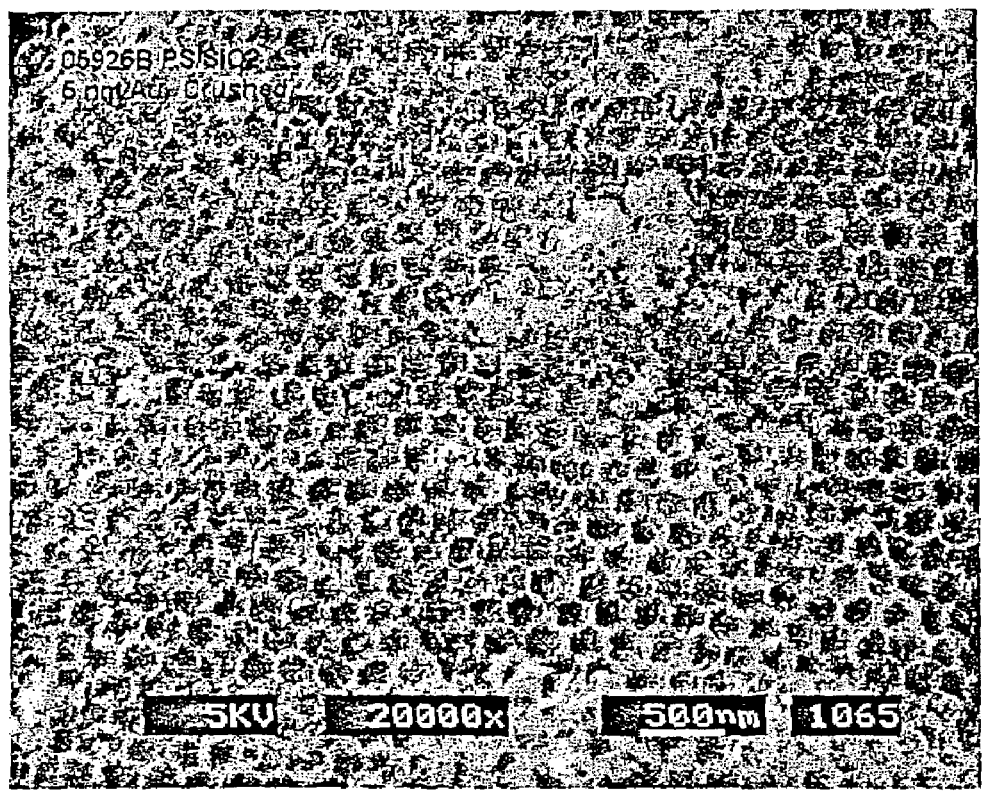
FIG. 3 is a scanning electron microscope (SEM) photograph of a crystal with an inverse opal-like structure produced by the moving bed filtration process of the instant invention, as described in Example 2 below.

Polystyrene spheres (from IDC) with a particle size of about 320 nm and about 2 weight % in water were assembled into ordered crystals by a stepwise moving bed vacuum filtration process. The filtration conditions were the same as given in example 1 above. Then the filtered layer was moved to the next stage where the crystal layer were infiltrated with a silica sol prepared by controlled hydrolysis of tetraethyl orthosilicate (TEOS). The packed monospheres with infiltrated silica sol were then dried as described in example 1. After drying, the material was removed from the filter and transferred to a crucible. The material was calcined at 500° C. for one hour to remove the polymer spheres that were used as the template for the inverse opal structure. As shown in FIG. 3, a highly ordered structure of uniform air-spheres in a silica matrix was obtained. A strong blue to bluish purple color was observed with this type of structure.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A process for the production of homogeneously packed opal-like or inverse opal-like sphere-based crystals comprising:
   (a) adding a sufficient amount of a suspension of monospheres having a particle size of 20 nanometers to 30 microns to a flat moving bed porous filtration membrane so as to form a layer thickness on the flat moving bed of 50 microns to 5 mm;
   (b) moving the monospheres on the moving bed filtration membrane substantially horizontally over a vacuum filtration zone, and applying a sufficient substantially constant vacuum filtration pressure to the monospheres to obtain crystalline homogeneously packed monospheres;
   (c) processing the packed monospheres for stabilization, said processing comprising heating and/or chemically bonding the crystalline packed monospheres.

2. A process according to claim 1, wherein processing of the packed monospheres for stabilization comprises infiltrating the packed monospheres with a chemical bonding agent.

3. A process according to claim 2, wherein the infiltrating step is accomplished while the packed monospheres are moving on the vacuum bed filtration membrane and while a vacuum filtration pressure is being applied to the packed monospheres.

4. A process according to claim 2, further comprising curing the chemical bonding agent.

5. A process according to claim 1, wherein the monospheres comprise $SiO_2$.

6. A process according to claim 1, wherein the monospheres comprise a polymeric material.

7. A process according to claim 1, for the production of inverse opal-like sphere based crystals wherein
   in step (c) the packed monospheres are processed for stabilization by infiltrating the packed monospheres with a bonding agent; and further comprising
   (d) removing the monospheric material to obtain an inverse opal-like structure comprising air-spheres.

8. A method according to claim 7, wherein the infiltrating step is accomplished while the packed monospheres are moving on the vacuum bed filtration membrane and while a vacuum filtration pressure is being applied to the packed monospheres.

9. A process according to claim 7, wherein the bonding agent comprises $SiO_2$, $Al_2O_3$, $TiO_2$, $SnO_2$, $Fe_2O_3$, $ZrO_2$, $CeO_2$ or $Y_2O_3$.

10. A process according to claim 6, wherein the polymeric material comprises polystyrene, polymethacrylate, or polyvinyltoluene.

11. A process according to claim 1, wherein the suspension has a concentration of monospheres of 2–50% by weight of solids.

12. A process according to claim 11, wherein the concentration is 10% to 20% by weight.

13. A process according to claim 1, wherein the vacuum pressure is about 400 to about 600 mm Hg.

14. A process according to claim 11, wherein the vacuum pressure is about 400 to about 600 mm Hg.

15. A process according to claim 12, wherein the vacuum pressure is about 400 to about 600 mm Hg.

16. A process according to claim 1, wherein the monospheres have a particle size in the range of 100 nanometers to 10 microns.

17. A process according to claim 14, wherein the monospheres have a particle size in the range of 150–450 nanometers.

18. A process according to claim 1, wherein the monospheres are deposited in a layer thickness of about 200 microns to 1 millimeter.

19. A process according to claim 16 wherein monospheres are deposited in a layer thickness of about 200 microns to 1 millimeter.

20. A process according to claim 17, wherein monospheres are deposited in a layer thickness of about 200 microns to 1 millimeter.

21. A process according to claim 1, wherein the pores of the porous filtration membrane is equal to or slightly smaller than the spheres to be filtered.

* * * * *